US010365341B2

(12) United States Patent
Oh et al.

(10) Patent No.: US 10,365,341 B2
(45) Date of Patent: Jul. 30, 2019

(54) METHOD AND APPARATUS FOR OBTAINING MAGNETIC RESONANCE IMAGE

(71) Applicant: SAMSUNG ELECTRONICS CO., LTD., Suwon-si (KR)

(72) Inventors: Keum-yong Oh, Yongin-si (KR);
Sang-young Zho, Seoul (KR);
Sang-heum Cho, Suwon-si (KR);
Jin-young Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1084 days.

(21) Appl. No.: 14/028,777

(22) Filed: Sep. 17, 2013

(65) Prior Publication Data

US 2014/0191753 A1 Jul. 10, 2014

(30) Foreign Application Priority Data

Jan. 4, 2013 (KR) ........................ 10-2013-0001215

(51) Int. Cl.
*G01R 33/483* (2006.01)
*G01R 33/563* (2006.01)
(52) U.S. Cl.
CPC ... *G01R 33/4835* (2013.01); *G01R 33/56383* (2013.01)
(58) Field of Classification Search
CPC ............. G01R 33/4835; G01R 33/543; G01R 33/56383; G01R 33/546
USPC ................................................. 324/307–309
See application file for complete search history.

(56) References Cited

U.S. PATENT DOCUMENTS

| 5,438,263 | A | 8/1995 | Dworkin et al. |
| 6,097,185 | A * | 8/2000 | Watanabe .......... G01R 33/4835 324/307 |
| 6,594,516 | B1 | 7/2003 | Steckner et al. |
| 8,188,743 | B2 | 5/2012 | Sugiura |
| 8,548,122 | B2 | 10/2013 | Hay et al. |
| 8,850,640 | B2 | 10/2014 | Buettner |
| 2005/0264286 | A1 | 12/2005 | Harder |
| 2005/0264288 | A1 | 12/2005 | Campagna et al. |
| 2006/0079755 | A1* | 4/2006 | Stazzone ............... A61B 5/055 600/410 |

(Continued)

FOREIGN PATENT DOCUMENTS

| CN | 1715945 A | 1/2006 |
| CN | 1732848 A | 2/2006 |

(Continued)

OTHER PUBLICATIONS

Communication dated Jul. 28, 2015 issued by the State Intellectual Property Office of P.R. China in counterpart Chinese Patent Application No. 201310646831.1.

(Continued)

*Primary Examiner* — Rishi R Patel
(74) *Attorney, Agent, or Firm* — Sughrue Mion, PLLC

(57) ABSTRACT

An MRI method includes: defining image regions on an object; setting imaging conditions for the defined image regions; and acquiring MR images for the image regions according to the set imaging conditions. The imaging conditions may be set by displaying information about the defined image regions and setting the imaging conditions for the image regions based on the displayed information.

27 Claims, 11 Drawing Sheets

(56) References Cited

U.S. PATENT DOCUMENTS

| | | | |
|---|---|---|---|
| 2007/0016001 | A1 | 1/2007 | Graf |
| 2007/0247159 | A1 | 10/2007 | Kuhara |
| 2008/0303519 | A1 | 12/2008 | Van Den Brink et al. |
| 2010/0060284 | A1* | 3/2010 | Sugiura ............ G01R 33/56383 324/318 |
| 2010/0244829 | A1 | 9/2010 | Zenge |
| 2011/0101980 | A1* | 5/2011 | Ohiwa ............... G01R 33/4833 324/309 |
| 2012/0217965 | A1 | 8/2012 | Vester |
| 2012/0317724 | A1 | 12/2012 | Buettner |
| 2013/0187651 | A1* | 7/2013 | Konta ................ G01R 33/5611 324/309 |

FOREIGN PATENT DOCUMENTS

| | | |
|---|---|---|
| CN | 1857157 A | 11/2006 |
| CN | 19933627 A | 7/2007 |
| CN | 101233521 A | 7/2008 |
| CN | 101843486 A | 9/2010 |
| CN | 102835972 A | 12/2012 |
| EP | 1362550 A1 | 11/2003 |
| JP | 8-191824 A | 7/1996 |
| JP | 2002010992 A | 1/2002 |
| JP | 2004000502 A | 1/2004 |
| JP | 2008167768 A | 7/2008 |
| JP | 2010088870 A | 4/2010 |
| KR | 1020060046356 A | 5/2006 |
| WO | 2007015196 A2 | 2/2007 |

OTHER PUBLICATIONS

Communication dated Mar. 13, 2014, issued by the European Patent Office in counterpart European Application No. 13194256.7.

Office Action dated Feb. 24, 2014, issued by the Korean Intellectual Property Office in counterpart Korean Application No. KR 10-2013-0001215.

Notice of Allowance dated Aug. 29, 2014, issued by the Korean Intellectual Property Office in counterpart Korean Application No. KR 10-2013-0001215.

Houchun H. Hu et al., "Variable Field of View for Spatial Resolution Improvement in Continuously Moving Table Magnetic Resonance Imaging", Magnetic Resonance in Medicine, 2005, vol. 54; p. 146-151, XP 55105454A.

David G. Kruger et al., "Dual-Velocity Continuously Moving Table Acquisition for Contrast-Enhanced Peripheral Magnetic Resonance Angiography", Magnetic Resonance in Medicine, 2005, vol. 53; p. 110-117, XP 002448305A, Wiley InterScience, www.interscience.wiley.com.

Tim Leiner et al., "Use of a Three-Station Phased Array Coil to Improve Peripheral Contrast-Enhanced Magnetic Resonance Angiography", Journal of Magnetic Resonance Imaging, 2004, vol. 20; p. 417-425, XP 55105456A, Wiley InterScience, www.InterscIence.wiley.com.

Communication dated Mar. 8, 2019, issued by the European Patent Office in counterpart European Application No. 13194256.7.

Dr. Peter Börnert et al. "Principles of Whole-Body Continuously-Moving-Table MRI" Journal of Magnetic Resonance Imaging, vol. 28, 2008 (pp. 1-12).

* cited by examiner

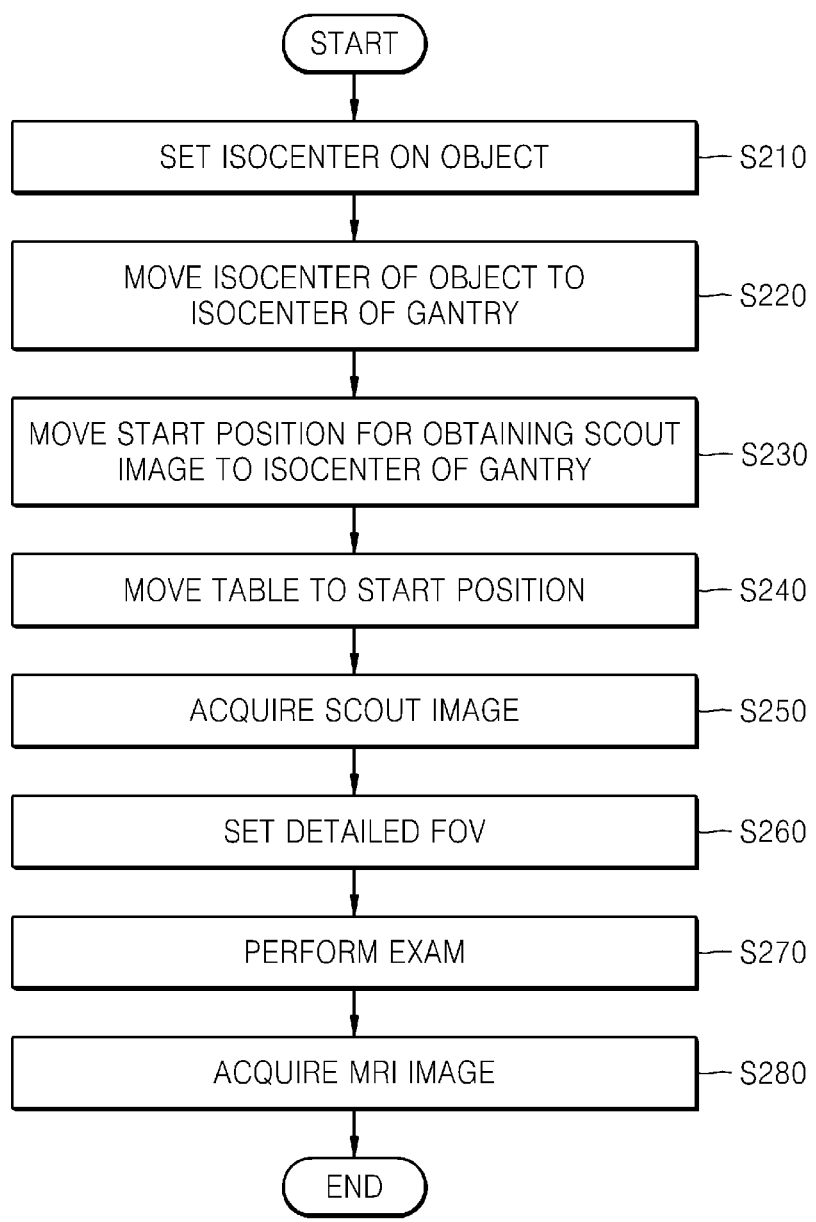

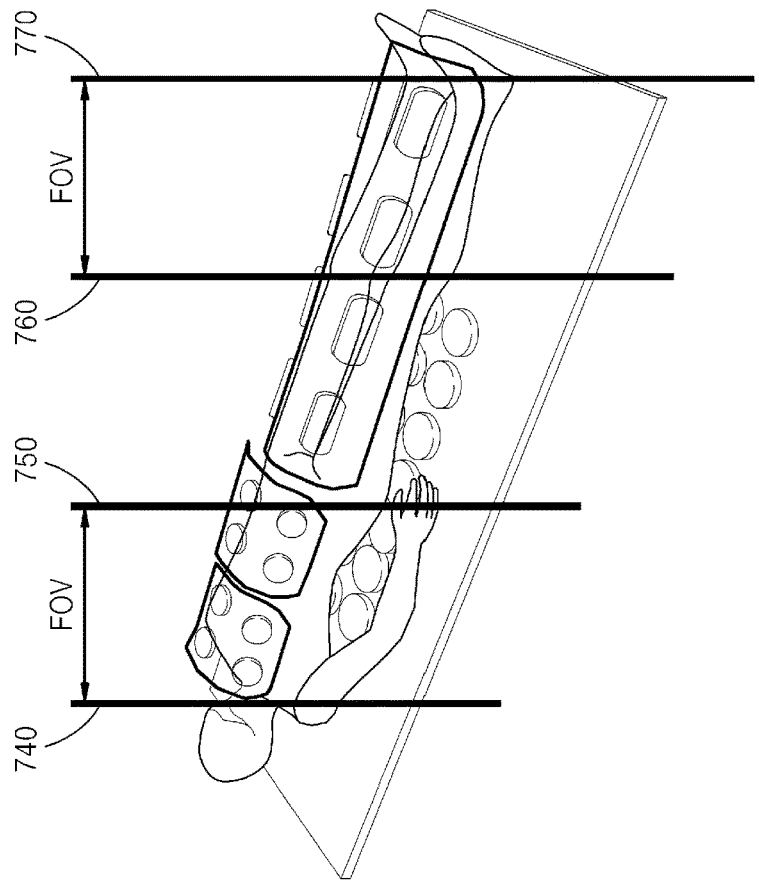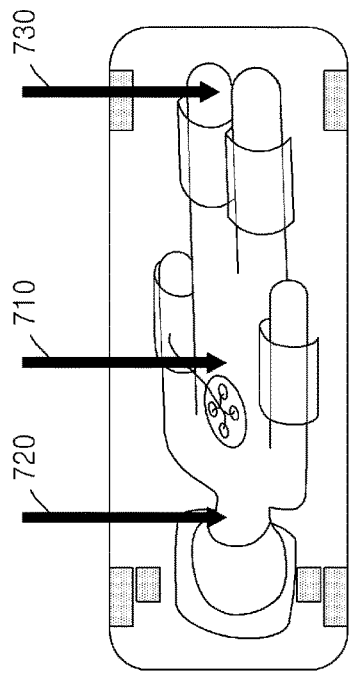

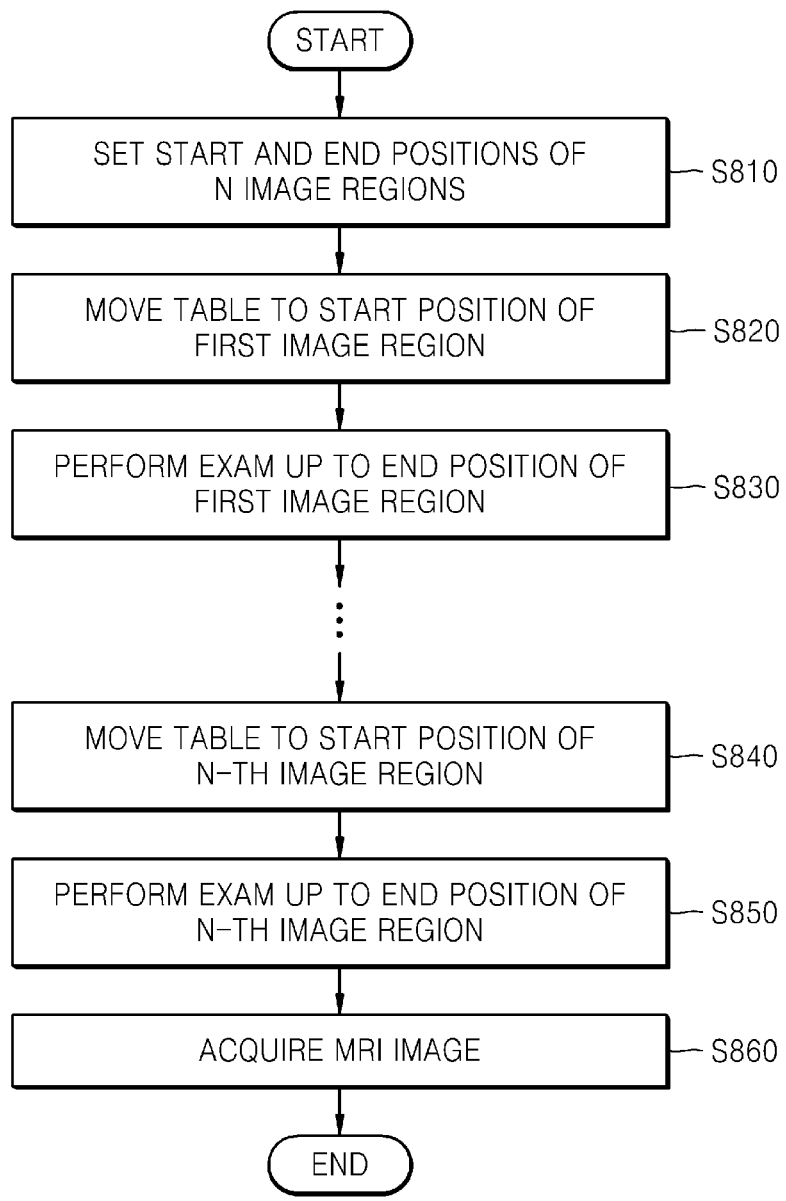

METHOD AND APPARATUS FOR OBTAINING MAGNETIC RESONANCE IMAGE

CROSS-REFERENCE TO RELATED PATENT APPLICATION

This application claims priority from Korean Patent Application No. 10-2013-0001215, filed on Jan. 4, 2013, in the Korean Intellectual Property Office, the disclosure of which is incorporated herein in its entirety by reference.

BACKGROUND

1. Field

Apparatuses and methods consistent with exemplary embodiments relate to acquiring a magnetic resonance (MR) image, and more particularly, to acquiring an MR image that allow setting of a plurality of regions and imaging of an independent MR image for each of the plurality of regions.

2. Description of the Related Art

Magnetic resonance images are obtained by using information determined through resonance of atomic nuclei exposed to a magnetic field. The resonance of atomic nuclei is a phenomenon where an atomic nucleus in a low energy state absorbs radio frequency (RF) energy and is excited to a higher energy state when a specific RF is incident on the atomic nucleus magnetized by an external magnetic field. Atomic nuclei have different resonant frequencies depending on their types, and resonance thereof is affected by the intensity of an external magnetic field. The human body includes a large number of atomic nuclei, and hydrogen nuclei are commonly used for magnetic resonance imaging (MRI).

An MRI system includes a magnet creating a main magnetic field in an imaging space, an RF coil generating an RF signal into the imaging space, and gradient coils creating magnetic field gradients for selecting a region of an object to be imaged from the imaging space. The MRI system applies pulse sequences designed for imaging the object to the RF coil and the gradient coils and acquires an echo signal corresponding to the RF signal generated into the imaging space. Signals output from the RF coil and the gradient coils have errors due to several factors, and these errors in the output signals may degrade a signal-to-noise ratio (SNR) of an MR image and cause artifacts in the MR image.

MRI systems use a noninvasive imaging technique and provide images with superior tissue contrast. In addition, unlike the computed tomography (CT) imaging, MRI images are not affected by bone artifacts. Furthermore, the MRI systems can produce various cross-sectional images in desired directions without changing a position of an object, and thus, they are widely used in many medical areas alone or in conjunction with other imaging diagnostic tools.

When a scout image of an object cannot be obtained by imaging a wide range of the object, it may be difficult to set a precise field of view (FOV). Furthermore, when MR images have to be acquired for different lesions in one object and the lesions are far away from each other although they are in the same local range, multiple MRI scans are required, which is not only time consuming and expensive but also causes adverse health effects due to a high specific absorption rate (SAR).

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

According to an aspect of an exemplary embodiment, there is provided a method of imaging a magnetic resonance image, including: defining a plurality of image regions on an object; setting imaging conditions for the defined plurality of image regions; and imaging magnetic resonance images for the plurality of image regions according to the set imaging conditions. The imaging conditions for the defined plurality of image regions includes displaying information about the defined plurality of image regions and setting imaging conditions for the plurality of image regions based on the displayed information about the plurality of image regions.

The imaging conditions for the plurality of image regions may include information about a protocol for each of the plurality of image regions, wherein the protocol may be set differently for each of the plurality of image regions.

The imaging conditions for the plurality of image regions may be set so that taking a scout image is omitted.

The imaging conditions for the plurality of image regions may be set so that a scout image is acquired.

The imaging conditions for the plurality of image regions may include a movement speed of a table on which the object is located for each of the plurality of image regions, wherein the movement speed of the table may be set differently for each of the plurality of image regions.

In the defining of the plurality of image regions on the object, at least one of imaging start and end points for each of the plurality of image regions may be automatically set by using an attachment fixed to the object or a table on which the object is placed.

In the defining of the plurality of image regions on the object, at least one of imaging start and end points for each of the plurality of image regions may be set by using a signal input through at least one external input device.

At least one external input device may set imaging start and end points when initiating and terminating application of a signal through the external input device, respectively, wherein the signal is applied for a predetermined time period.

The external input device may be built in a table on which the object is located.

The external input device may be built in an operating console.

The external input device may be at least one of a button, a joystick, a touch panel, a switch, and a sensor.

According to another aspect of an exemplary embodiment, there is provided an apparatus for imaging a magnetic resonance image, including: an image region definer for defining a plurality of image regions on an object; an imaging condition setter for setting imaging conditions for the defined plurality of image regions; and a magnetic resonance imaging unit for imaging magnetic resonance images for the plurality of image regions according to the set imaging conditions. The imaging condition setter includes a display for displaying information about the defined plurality of image regions and a setting portion for setting imaging conditions for the plurality of image regions based on the displayed information about the plurality of image regions.

The imaging conditions for the plurality of image regions may include information about protocols for each of the plurality of image regions, wherein the protocols may be set differently for each of the plurality of image regions.

The imaging conditions for the plurality of image regions may be set so that taking a scout image is omitted.

The imaging conditions for the plurality of image regions may be set so that a scout image is acquired.

The imaging conditions for the plurality of image regions may include a movement speed of a table on which the object is located for each of the plurality of image regions, wherein the movement speed of the table may be set differently for each of the plurality of image regions.

The image region definer may automatically set at least one of imaging start and end points for each of the plurality of image regions by using an attachment affixed to the object or a table on which the object is placed.

The image region definer may further include an external input device and set at least one of imaging start and end points for each of the plurality of image regions by using a signal input through at least one external input device.

The image region definer may set imaging start and end points when initiating and terminating application of a signal through the external input device, respectively, wherein the signal is applied for a predetermined time period.

The external input device may be built in a table on which the object is located.

The external input device may be built in an operating console.

The external input device may be at least one of a button, a joystick, a touch panel, a switch, and a sensor.

According to another aspect of an exemplary embodiment, there is provided a computer-readable recording medium having recorded thereon a program for executing the above-described methods.

BRIEF DESCRIPTION OF THE DRAWINGS

The above and/or other aspects will become more apparent by describing certain exemplary embodiments, with reference to the accompanying drawings, in which:

FIG. 2 is a flowchart of a method of imaging an MR image for one field-of-view (FOV) by using an isocenter;

FIGS. 7A and 7B illustrate the position of an isocenter on the object, a start position and an end position for obtaining a scout image, and a plurality of FOVs;

FIG. 8 is a flowchart of a method of imaging a plurality of image regions according to an exemplary embodiment;

DETAILED DESCRIPTION

Figure 1A:
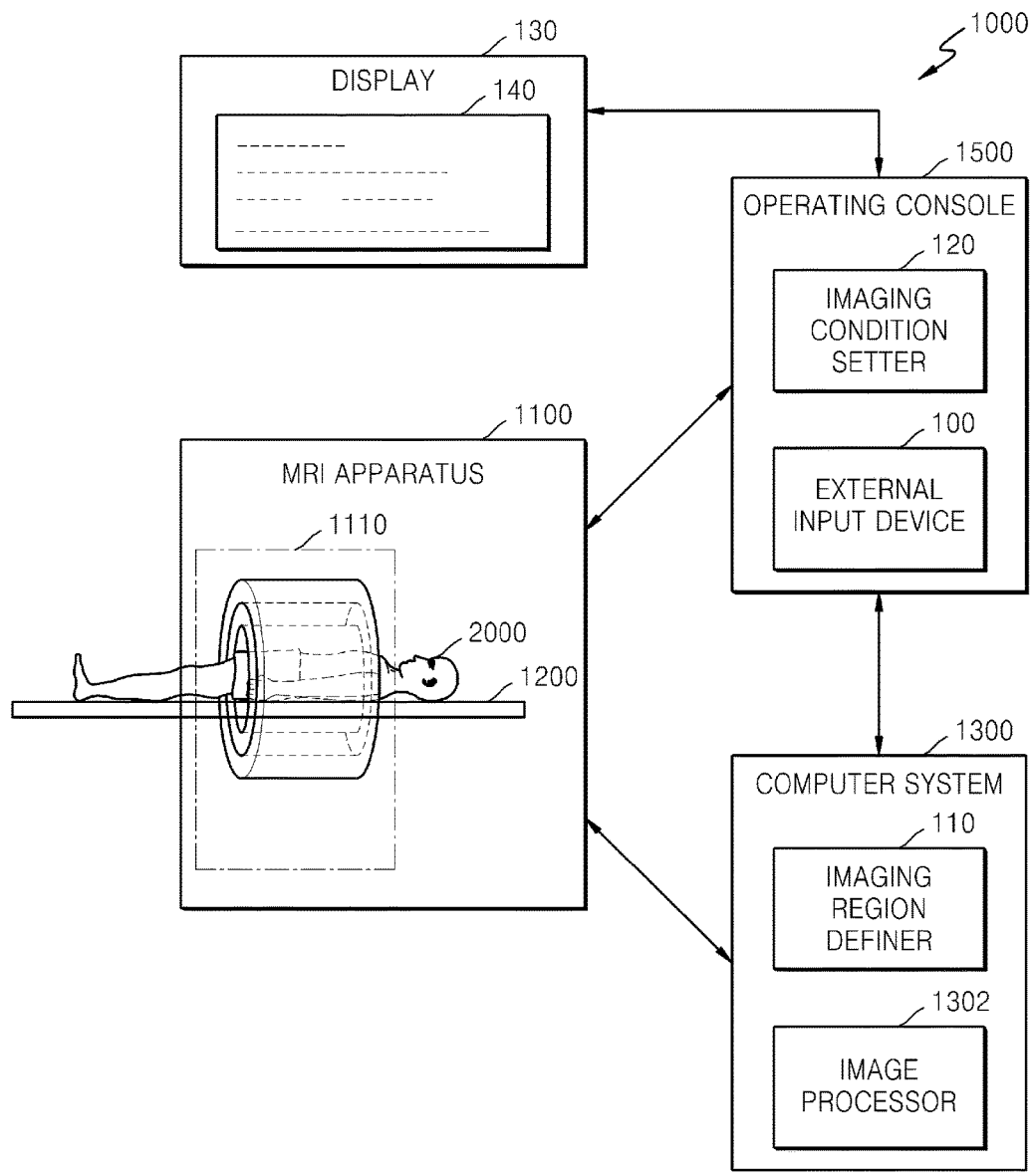
FIG. 1A is a diagram schematically illustrating the general structure of a magnetic resonance imaging (MRI) system.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

The apparatus components as described herein may correspond, but is not limited to, software and/or hardware components, such as an FPGA or ASIC, and/or may reside on an addressable storage medium and configured to execute on one or more processors. Thus, they may include, for example, software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules.

Although the terms used herein are generic terms which are currently widely used and are selected by taking into consideration functions thereof in exemplary embodiments, the meanings of the terms may vary according to the intentions of persons skilled in the art, legal precedents, or the emergence of new technologies. Furthermore, some specific terms may be randomly selected by the applicant, in which case the meanings of the terms may be specifically defined in the description. Thus, the terms should be defined not by simple appellations thereof but based on the meanings thereof and the context of the description. As used herein, expressions such as "at least one of," when preceding a list of elements, modify the entire list of elements and do not modify the individual elements of the list.

It will be understood that when the terms "includes," "comprises," "including," and/or "comprising," when used in this specification, specify the presence of stated elements and/or components, but do not preclude the presence or addition of one or more elements and/or components thereof.

An object according to an exemplary embodiment may include a portion of a human body. For example, the object may include internal organs such as the liver, heart, uterus, brain, breast, and abdomen.

An "object" may mean any internal organ or portion in a human body or animal. The object may be or include a phantom. A phantom is an anatomical model made of a material having a volume closely approximating the density and effective atomic number of a living tissue. A phantom according to an exemplary embodiment may be a spherical water phantom having similar properties to a human tissue.

An "imaging space" is a space in which an object is accommodated or maintained and may include a space to and/or from which a medical imaging apparatus applies and/or receive predetermined signals in order to obtain an image signal generated by the object. For example, for an MRI system incorporating a cylindrical gantry, a bore of the gantry may be an imaging space of the MRI system.

A "user" means a medical professional, and includes, but is not limited to, a doctor, a nurse, a medical technologist, a medical imaging professional, and a medical equipment repair technician.

A "pulse sequence" is a sequence of signals which are repeatedly applied in an MRI system. The pulse sequence may include time parameters of a radio frequency (RF) pulse, such as Repetition Time (TR) and Time to Echo (TE).

A "gradient pulse" is a signal which is applied to a gradient coil to cause an intentional perturbation in a magnetic field within an imaging space.

FIG. 1A is a diagram schematically illustrating the general structure of a magnetic resonance imaging (MRI) system 1000.

The MRI system 1000 includes an MRI apparatus 1100, a computer system 1300, and an operating console 1500. Although the MRI apparatus 1100, the computer system 1300, and the operating console 1500 are illustrated as separate elements in FIG. 1A, one or more of the MRI apparatus 1100, the computer system 1300, and the operating console 1500 may be integrated with each other.

The MRI apparatus 1100 receives a control signal for generating an MR image from the operating console 1500, operates in response to the control signal, and acquires an MR signal used to generate an MR image from an object 2000 located on a table 1200 within a magnet system 1110. The MRI apparatus 1100 outputs an image signal generated from the MR signal to the computer system 1300. The table 1200 may be referred to as a couch, cradle, or bed.

The computer system 1300 receives the image signal from the MRI apparatus 1100, reconstructs the image signal to generate an MR image of a predetermined region of the object 2000, and transmits the MR image to the operating console 1500.

The computer system 1300 may include an image processor 1302 for reconstructing the image signal generated from the MR signal and generating the MR image, a storage (not shown) for storing the image signal and the MR image, and an interface unit (not shown) connected with the MRI apparatus 1100 and the operating console 1500.

The operating console may include a monitor (not shown) for receiving the MR image generated by the computer system 1300 and displaying the MR image, various input units (not shown), such as a keyboard and a mouse, for receiving control information from a user, and a panel for displaying scanning conditions and scanning status.

Figure 1B:
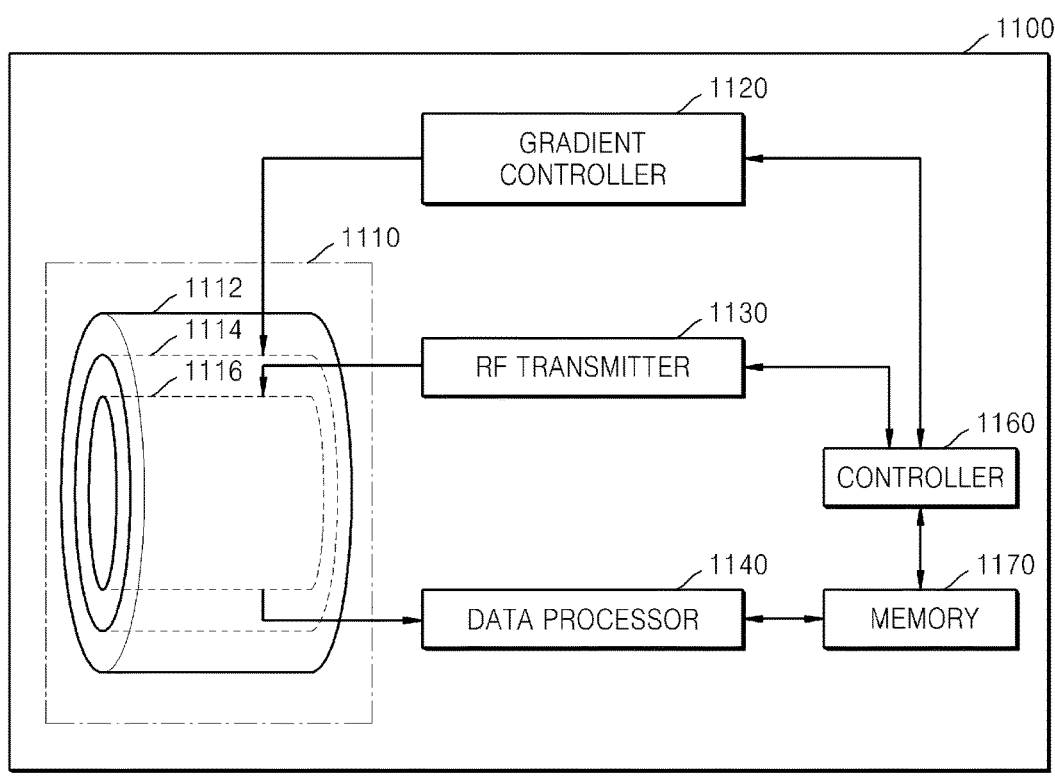
FIG. 1B illustrates an example of an internal configuration of an MRI apparatus in the MRI system of FIG. 1A.

FIG. 1B illustrates an example of an internal configuration of the MRI apparatus 1100 in the MRI system 1000 of FIG. 1A.

The MRI apparatus 1100 applies a magnetic field and an RF pulse to the object 2000 and acquires an MR signal emitted from the object 2000 in response thereto. Referring to FIG. 1B, the MRI apparatus 1100 includes the magnet system 1110, a gradient controller 1120, an RF transmitter 1130, a data processor 1140, a controller 1160, and a memory 170. The magnet system 1110 includes a main magnet 1112, gradient coils 1114, and an RF coil 1116.

The main magnet 1112 may create a static magnetic field in a bore of the magnet system 1110. For example, the static magnetic field may be placed parallel or perpendicular to a body axis of the object 2000, e.g., a longitudinal direction thereof.

A permanent magnet, resistive magnet, or a super conductive magnet may be used to realize the main magnet 1112. For convenience of explanation, it is assumed that a super conductive magnet is used as the main magnet 1112, and a horizontal static magnetic field is created to be parallel to the body axis of the object 2000.

When a super conductive magnet is used as the main magnet 1112, as shown in FIG. 1B, the gradient coils 1114 and the RF coil 1116 may be disposed around a common central axis. For example, the main magnet 1112, the gradient coils 1114, and the RF coil 1116 may be sequentially arranged from outside to inside. The table 1200 on which the object 2000 is disposed is moved into the bore of the magnet system 1110 so that a magnetic field and an RF pulse are applied to the object 2000.

Hydrogen atomic nuclei have magnetic moments, e.g., magnetic dipole moments, due to a spin motion, and the magnetic moments thereof are randomly oriented in the absence of an external magnetic field. However, when hydrogen atoms are placed within a static magnetic field, the nuclei of the atoms are aligned in the direction of the static magnetic field to reach a lower energy state. A nucleus of a hydrogen atom has a Larmor frequency of 42.58 MHz in a magnetic field of 1.0 Tesla. When an electromagnetic wave is applied to the atomic nucleus at the Larmor frequency, the atomic nucleus transits from a lower energy state to a higher energy state.

The gradient coils 1114 create magnetic field gradients in different directions in the object 2000, for example, along three perpendicular axes. When an RF pulse having the Larmor frequency is applied to the object 2000 within a static magnetic field, MR signals are emitted at once by tissues having similar properties so that it is difficult to distinguish these tissues. Magnetic field gradients are used to solve this problem.

A magnetic field gradient which linearly varies across a space such that the Larmor frequency changes with position is used to selectively resonate nuclei of hydrogen atoms in a predetermined region of the object 2000 corresponding to a region of interest. The three perpendicular axes are a slice axis, a frequency axis, and a phase axis. When three orthogonal coordinate axes are x, y, and z axes in a bore where a static magnetic field exists, any of the three orthogonal coordinate axes may be a slice axis. One of the remaining two axes may be a frequency axis, and the other may be a phase axis. The slice axis may be inclined by an angle with respect to the body axis, i.e., longitudinal direction of the object 2000. The gradient coils 1114 may create three types of magnetic field gradients in the x, y, and z-axis directions. A slice selection gradient is applied to create a magnetic field gradient along a body axis of the object 2000 as a precondition for selectively exciting a slice perpendicular to the body axis of the object 2000. A frequency encoding gradient and a phase encoding gradient are applied to obtain two-dimensional (2D) spatial information within a selected slice plane.

When a slice selection gradient is applied to create a magnetic field gradient along the z-axis direction, an xy-plane orthogonal to the z-axis may be selected. A frequency encoding gradient and a phase encoding gradient are applied to obtain 2D position information about the selected xy-plane.

During a time interval in a RF pulse sequence corresponding to a repetition time (TR), a phase encoding gradient is used to cause a specific phase shift of magnetic dipole moments of atomic nuclei in the y-axis direction within a selected slice plane. A frequency encoding gradient is then used to induce a frequency shift in the x-axis direction at a position on the y-axis having undergone the phase shift to thereby acquire an echo signal. An echo signal is obtained for a portion of the predetermined region of the object 2000, e. g., a k-space scan line signal corresponding to one line of a k-space. During each of the remaining intervals in the RF pulse sequence, a phase encoding gradient and a frequency encoding gradient are used to induce a frequency shift along the x-axis direction at a different position on the y-axis and acquire an echo signals for a corresponding portion of the predetermined region of the object 2000. Thereby, echo signals may be obtained for the entire predetermined region of the object 2000. By using the echo signals for the entire predetermined region of the object 2000, scan line signals may be uniformly acquired for the entire k-space.

At least two encoding methods are used for each of the gradient coils 1114 to generate images having different resolutions. For example, a frequency encoding gradient may create a magnetic field gradient in a frequency axis direction. The sampling interval, i.e., the number of samples, may be varied by changing a frequency encoding method. A change in the frequency encoding method means a change in a slope of a magnetic field gradient created by a frequency encoding gradient. For sampling of an MR signal which is used in generating a low resolution image, a slope of a magnetic field gradient may be decreased. On the other hand, for sampling an MR signal which is used in generating a high resolution image, a slope of a magnetic field gradient may be increased.

The RF coil 1116 applies an RF pulse for acquiring an MR signal from the object 2000 and receives an MR signal emitted from the object 2000 in response to the RF pulse. In other words, the RF coil 1116 transmits the RF pulse and receives the MR signal. The RF coil 1116 may apply different types of RF pulses to the object 2000. For example, the RF pulse may be an excitation RF pulse or a refocusing RF pulse. Each RF pulse may be a 90° or 180° RF pulse. Furthermore, various types of RF pulse sequences, each sequence including a plurality of RF pulses, may be applied to the object 2000. For example, the RF pulse sequence may be a spin echo sequence, a fast spin echo sequence, a gradient echo sequence, or a field echo sequence.

The gradient controller 1120 is connected to the gradient coils 1114 and outputs a signal for forming a magnetic field gradient to the gradient coils 1114. The gradient controller 1120 includes gradient driving circuits corresponding to the respective three gradient coils for slice axis, frequency axis, and phase axis. The gradient controller 1120 may include a waveform synthesizer (not shown) and an RF amplifier (not shown).

The RF transmitter 1130 is connected to the RF coil 1116, generates a RF pulse and a pulse sequence that is applied by the RF coil 1116, and outputs the RF pulse and the pulse sequence to the RF coil 1116. The RF transmitter 1130 includes a RF oscillator (not shown) for oscillating RF pulses, a phase shifter (not shown) for changing phases of the RF pulses, a waveform synthesizer for creating an appropriate RF pulse sequence, a modulator (not shown) for modulating the RF pulse sequence, and an RF amplifier (not shown) for amplifying RF pulses. The RF transmitter 1130 may be integrated with the data processor 1140 and a transceiver.

The data processor 1140 is coupled to the RF coil 1116, acquires an MR signal from the RF coil 1116, demodulates the MR signal, filters out noise therefrom, and converts the resultant signal into digital data. The MR signal may be a free induction decay (FID) signal produced in response to an excited RF pulse, or an echo signal produced in response to a refocusing RF pulse. The data processor 1140 includes a preamplifier (not shown) which amplifies the received MR signal, a demodulator (not shown) which demodulates the amplified MR signal, a low pass filter (LPF) which filters out noise therefrom, and an analog-to-digital converter (ADC) (not shown) which converts the demodulated analog signal into a digital form.

FIG. 2 is a flowchart of a method of imaging an MR image for one field-of-view (FOV) by using an isocenter.

In an MRI apparatus, the isocenter becomes a central point of a magnetic field. In general, a center of a bore or gantry in the MRI apparatus may be an isocenter. A magnetic field gradient may vary linearly in strength along a main magnetic field. Since the strength of the magnetic field gradient increases on one side of the isocenter but decreases on the other side thereof, the magnetic field gradient is unchanged at the isocenter. The object 2000 needs to be located at the isocenter of the gantry during examination because when the object 2000 is positioned outside the isocenter, the object 2000 may be severely exposed to magnetic fields and a noise level may be increased.

Referring to FIGS. 1A and 2, the object 2000 is fixed onto the table 1200 of the MRI apparatus 1100, and an isocenter is set on the object 2000 (operation S210). The isocenter is typically set on the object 2000 by using a laser beam pointer. The laser beam pointer irradiates a laser beam onto the object 2000 fixed onto the table 1200 outside the gantry to indicate a position of the isocenter. Through this process, the MRI system 1000 identifies the position of the isocenter on the object 2000, and the identified position of the isocenter may be used as a reference point for an imaging area on the object 2000.

After identifying the position of the isocenter on the object 2000, the table 1200 on which the object 2000 is placed moves into the gantry so that the isocenter set on the object 2000 coincides with an isocenter of the gantry (operation S220).

Thereafter, a user sets a start position and an end position for obtaining a scout image based on a region of the object 2000 to be imaged (operation S230). The scout image may be referred to as a scout localization image or localizer image. Scout images are acquired before obtaining MR images for diagnostic purposes to determine an angle at which each cross-sectional image will be acquired. The scout image may also serve as an index for a position of MRI image data. In general, scout images are used to identify the location and overall shape of an internal organ or lesion and obtained at a lower resolution than a diagnostic MR image.

After setting the start position and the end position for obtaining a scout image of the object 2000, the table 1200 is moved so that the start position for obtaining a scout image is located at the isocenter of the gantry, and the scout image is acquired until the end position (operations S240 and S250). However, since the user does not have information other than the information about the isocenter set on the object 2000, the start position and the end position for obtaining a scout image may be approximate positions. Thus, the scout image may be taken over a wide range for precise data acquisition.

After obtaining the scout image, the scout image is transmitted to the operating console 1500 and displayed on a monitor so that the user can set more accurate start position and end position of a FOV based on locations of a lesion and an internal organ or skeleton obtained from the scout image (operation S260). The FOV refers to an image area or portion to be imaged, and, in particular, a specific region of the object 2000 in an MR image.

Examination is performed according to the detailed FOV set in operation S260, and an MRI image is acquired (operations S270 and S280). The MRI image may be a 2D image of a slice of the object 2000 that is perpendicular to the axis of motion, or a 3D image containing the axis of motion.

Figure 3B:
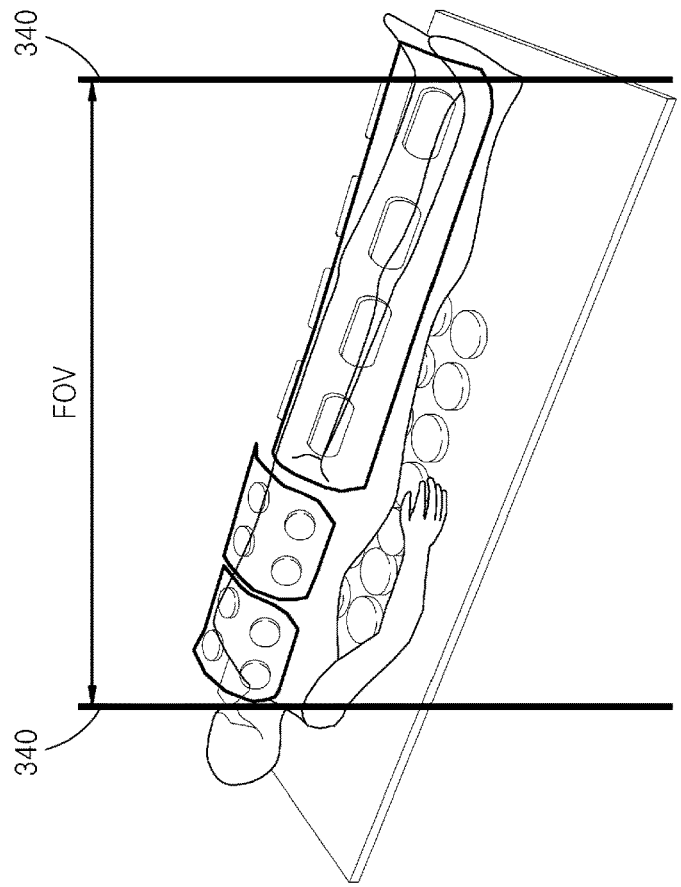
FIGS. 3A and 3B illustrate the position of an isocenter on the object, start position and end position for obtaining a scout image, and an FOV.
Figure 3A:
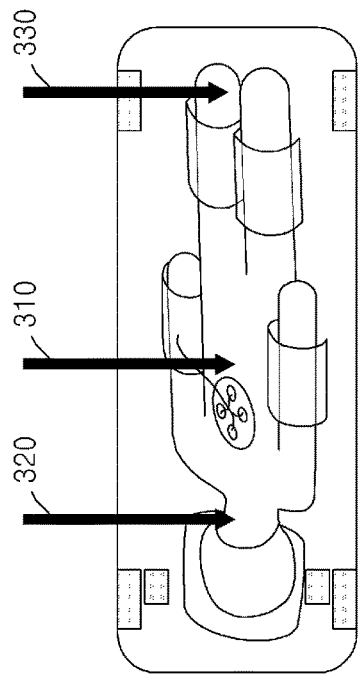

FIGS. 3A and 3B illustrate the position of an isocenter 310 set on the object 2000, a start position 320 and an end position 330 for obtaining a scout image, and an FOV described in the method of FIG. 2.

In general, an isocenter 310 is set at a center of a portion of the object 2000 to be imaged, and the start position 320 and the end position 330 for obtaining a scout image are set based on positions relative to the isocenter 310 to thereby determine a range in which a scout image is taken. After determining the start position and the end position for obtaining a scout image, the scout image is taken and then transmitted to the operating console 1500 to be displayed on the monitor.

The user then sets a start position 340 and an end position 350 of an FOV based on information about locations of a lesion and an internal organ or skeleton obtained from the scout image, and takes an MRI image over the set FOV.

Figure 4:
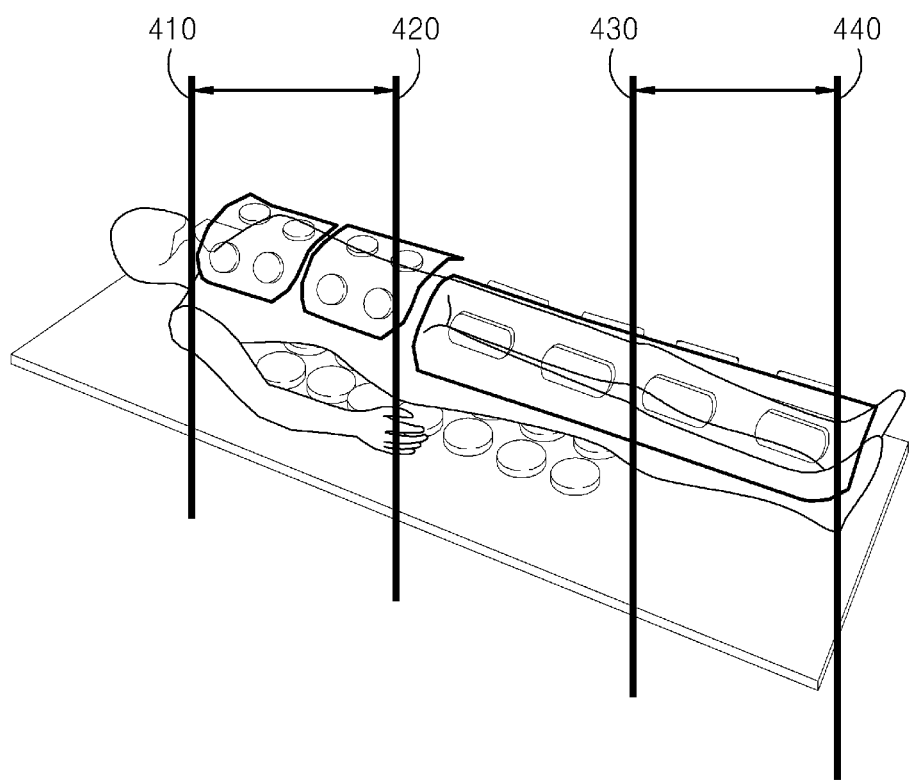
FIG. 4 illustrates a plurality of image regions of an object.

FIG. 4 illustrates a plurality of N (=2) image regions of the object 2000.

The methods illustrated in FIGS. 2 and 3 are applied when only one region of the object 2000 is imaged, so that only one FOV is set. However, when an MRI scan is performed on a plurality of image regions of the object 2000, a plurality of FOVs may be set. For example, referring to FIG. 4, the plurality of image regions to be imaged may be a first image region of the object 2000 extending from position 410 to position 420 and a second image region extending from position 430 to position 440.

Figure 5:
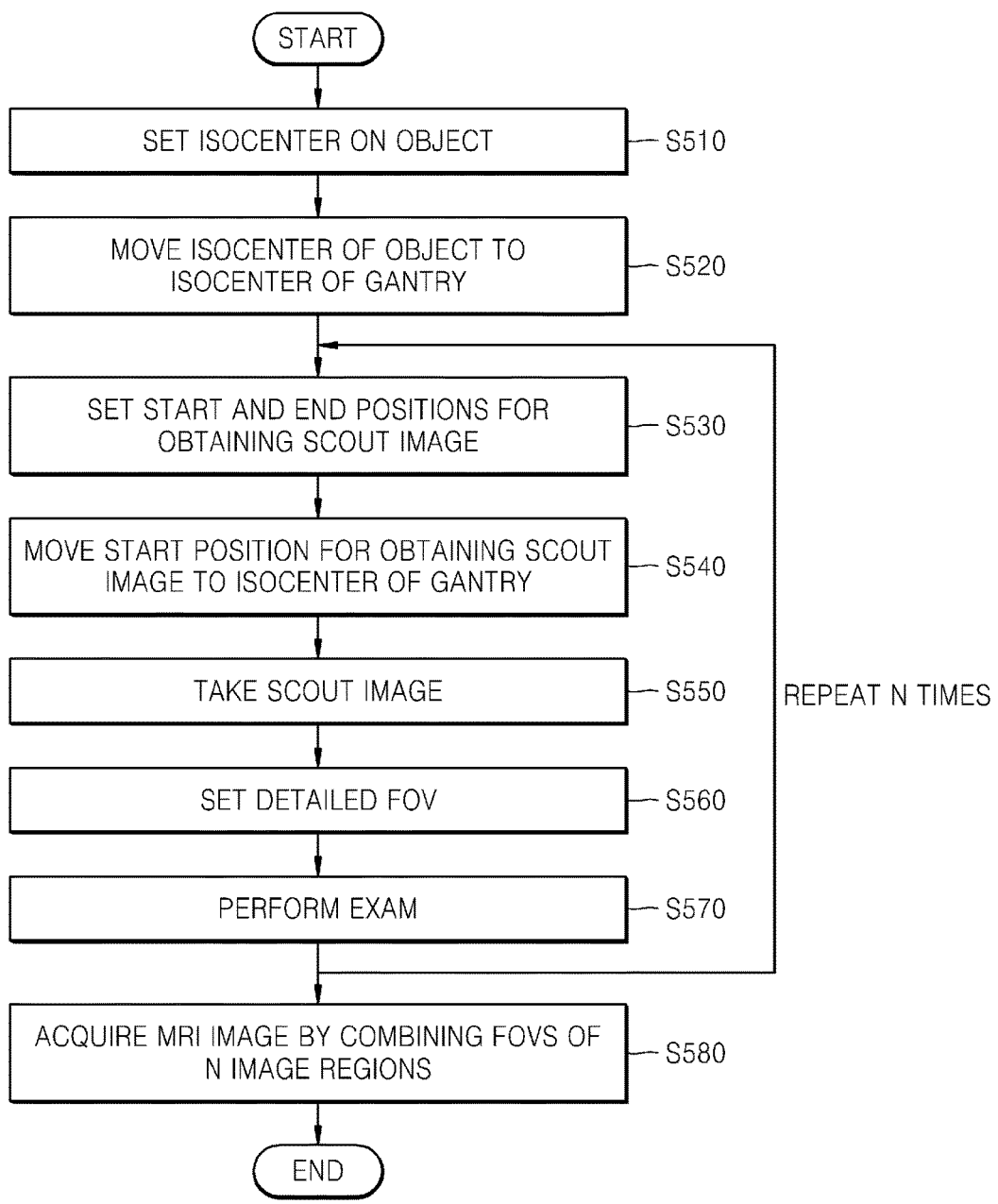
FIG. 5 is a flowchart of a method of imaging a plurality of image regions of an object.

FIG. 5 is a flowchart of a method of obtaining MR images when MR imaging is needed for a plurality of N image regions of an object.

In a related art MRI apparatus, it may be difficult to take a scout image over a wide range. In order to set an FOV by using a scout image, the method of FIG. 2 is repeatedly performed N times on each image region.

A process of setting FOVs for an example including two image regions (N=2), by using scout images when the first image region extending from 410 to 420 and the second image region extending from 430 and 440 are imaged as illustrated in FIG. 4, will now be described with reference to FIG. 5. An isocenter is set on an object with respect to the first image region (operation S510), and then the set ISO center is moved to an isocenter of a gantry (operation S520). A start position and an end position for obtaining a scout image are set (operation S530), and the scout image is acquired (operation S550). A detailed FOV is set by using information obtained from the scout image (operation S560), and examination is performed on the first image region (operation S570). After completing the examination of the first image region, the same operations S510 through S570 are repeated for the second image region.

Figure 6:
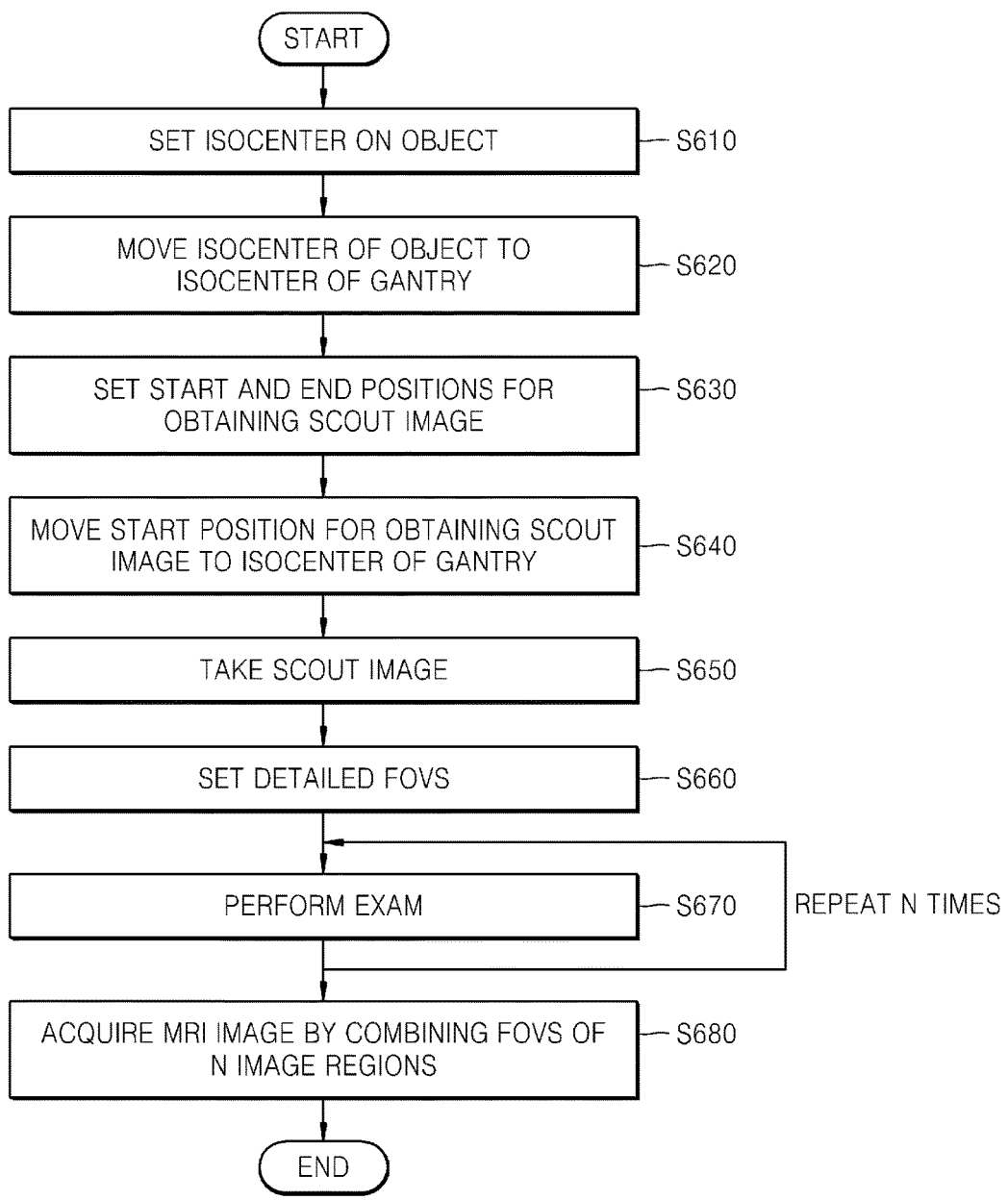
FIG. 6 is a flowchart of a method of imaging a plurality of image regions of an object.

FIG. 6 is a flowchart of another method of obtaining MR images when MR imaging is acquired for a plurality of N image regions of the object 2000.

Referring to FIG. 6, after identifying a position of an isocenter on the object 2000 (operation S610), the table 1200 having the object 2000 fixed thereon is moved into a gantry so that an isocenter set on the object 2000 coincides with an isocenter of the gantry (operation S620).

The user then sets a start position and an end position for obtaining a scout image based on a region of the object to be imaged (operation S630). The start position for obtaining a scout image becomes a start position of the first image region, and the end position for obtaining a scout image becomes an end position of an N-th image region. After setting the start position and the end position for obtaining a scout image in operation S630, the table 1200 is moved so that the start position for obtaining a scout image is located at the isocenter of the gantry before obtaining the scout image, and the scout image is acquired until the end position for obtaining a scout image is located at the isocenter of the gantry (operations S640 and S650).

After obtaining the scout image, the scout image is transmitted to the operating console 1500 and displayed on the monitor so that the user can set start positions and end positions of a plurality of N FOVs based on locations of a lesion and an internal organ or skeleton obtained from the scout image (operation S660).

Examination is performed according to the detailed FOVs set in operation S660, and an MRI image is acquired for the plurality of N FOVs (operations S670 and S680).

FIGS. 7A and 7B illustrate the position of an isocenter 710 of the object 2000, a start position 720 and an end position 730 for obtaining a scout image, and a plurality of N (=2) FOVs according to the method of FIG. 6.

When MR imaging is needed for the brain and legs, a scout image is obtained over a range of the object 2000 from the start position 720 of a first image region of the brain to the end position 730 of a second image region of the legs.

Since a scout image is used to localize apparently unidentified lesions and internal organs or skeletons, the scout image may be acquired over a range as wide as possible.

After obtaining the scout image over a range from the start position 720 to the end position 730, the scout image is transmitted to the operating console 1500 and displayed on the monitor so that the user can set start and end positions 740 and 750 of a first FOV and start and end positions 760 and 770 of a second FOV based on information obtained from the scout image. Then, examination is performed according to the first and second FOVs.

When MR images are acquired according to the methods of FIGS. 5 and 6, image reconstruction is performed on data for FOVs to thereby acquire an MRI image of the entire object 2000.

FIGS. 2 through 7 show the methods for setting a detailed FOV by using a scout image. A localization sequence is used to obtain the scout image.

In the methods described above, a single scout image is acquired for the entire image area and a plurality of FOVs are set for examination, but a different MRI protocol cannot be set for each FOV. Thus, in order to take an MRI image by using a different protocol for each FOV, a new scout image has to be acquired for every FOV, and a protocol needs to be changed for examination after setting the desired FOV.

A protocol refers to all detailed information regarding MR imaging such as magnetic field strength, slice thickness and gap, sequence type, the type of contrast agent, prescription, and options. Although a scout image is acquired using one protocol in an exemplary embodiment, this is not limiting. A protocol may be predetermined for each type of illness and/or tissue and may be modified when needed.

Table 1 shows an example of an MRI protocol for imaging the brain and the spinal cord.

TABLE 1

| | |
|---|---|
| Field Strength | No specific recommendations on magnet size or strength. Scans should be of good quality, with adequate signal noise ratio (SNR) and resolution (in slice pixel resolution of <1 mm × 1 mm) |

TABLE 1-continued

| | |
|---|---|
| Slice thickness and gap | <3 mm, no gap for brain and spinal cord, except <4 mm, no gap for axial spinal cord |
| Core Brain MRI Sequences | Sagittal Fluid Attenuated Inversion Recovery (FLAIR) Axial FLAIR Axial T2 Axial T1 pre and post gadolinium |
| Gadolinium | Single dose 0.1 mmol/kg given over 30 seconds Minimum 5 minute delay before obtaining post gadolinium T1 One of the other sequences (e.g. FLAIR, T2) can be acquired during the 5 min post gadolinium delay. |
| Options for Brain MR | Axial proton density (PD) 3D IR prepared T1 gradient echo (1.0.1.5 mm thickness) |
| Brain MRI Scan Prescription and Coverage | Whole brain coverage Use subcallosal plane on sagittal localizer to prescribe the axial slice. |
| Core Spinal Cord MRI Sequence | Cervical Cord coverage Sagittal T2 Sagittal PD or STIR (Short Tau Inversion Recovery) Sagittal T |
| Options for Spinal Cord MRI | Post Gadolinium T1 3D IR prepared T1 gradient echo (1.0.1.5 mm thickness) Thoracic Cord and Conus coverage Gadolinium does not need to be given for a spinal cord MRI if it follows a contrast Brain MRI study. |

FIG. 8 is a flowchart of a method of imaging an MR image with a plurality of N FOVs according to an exemplary embodiment.

Referring to FIG. 8, in order to set a plurality of N image regions, imaging start and end positions may be set for each of a plurality of N image regions without obtaining a scout image (operation S810). In this case, imaging conditions of an MR image may be set for each of the plurality of N image regions. The imaging conditions may include an MRI protocol, and a protocol for imaging a scout image may be set if a scout image is to be obtained.

A protocol for each image region may be different depending on a portion where a lesion occurs and kind of a lesion. Thus, the method of imaging an MR image according to an exemplary embodiment allows acquisition of an MR image by setting image regions without obtaining a scout image first.

A movement speed of the table 1200 on which the object 2000 is placed may be set for each of the plurality of N image regions and determined according to the corresponding protocol. The movement speed of the table 1200 may also be set differently for each image region.

After setting the start and end positions and imaging conditions of the respective N image regions, the table 1200 moves to a start position of a first image region (operation S820), and examination is performed on the first image region from the start position to an end position thereof according to the imaging conditions for the first image region (operation S830). After finishing the examination of the first image region, the table 1200 moves to a start position of a second image region, and examination is performed on the second image region according to imaging conditions therefor, similarly to what is described above with respect to operations S820 and S830.

In a similar manner, the examination is performed on any remaining image regions, for example third through (N–1) image regions, and/or on an N-th image region (operations S840 and S850), and seamless MR image data is acquired without image composition of image data (operation S860).

According to an exemplary embodiment, imaging conditions for the N image regions may be set before or after determining the start and end positions of the image region.

According to an exemplary embodiment, after setting the start and end positions of the N image regions, information about the image region may be verified through a monitor or other displays, and the set image region may be modified when needed.

According to an exemplary embodiment, after setting start and end positions for the N image regions, imaging conditions for the image region may be set, or the preset imaging conditions may be modified through a monitor or other displays.

Figure 9:
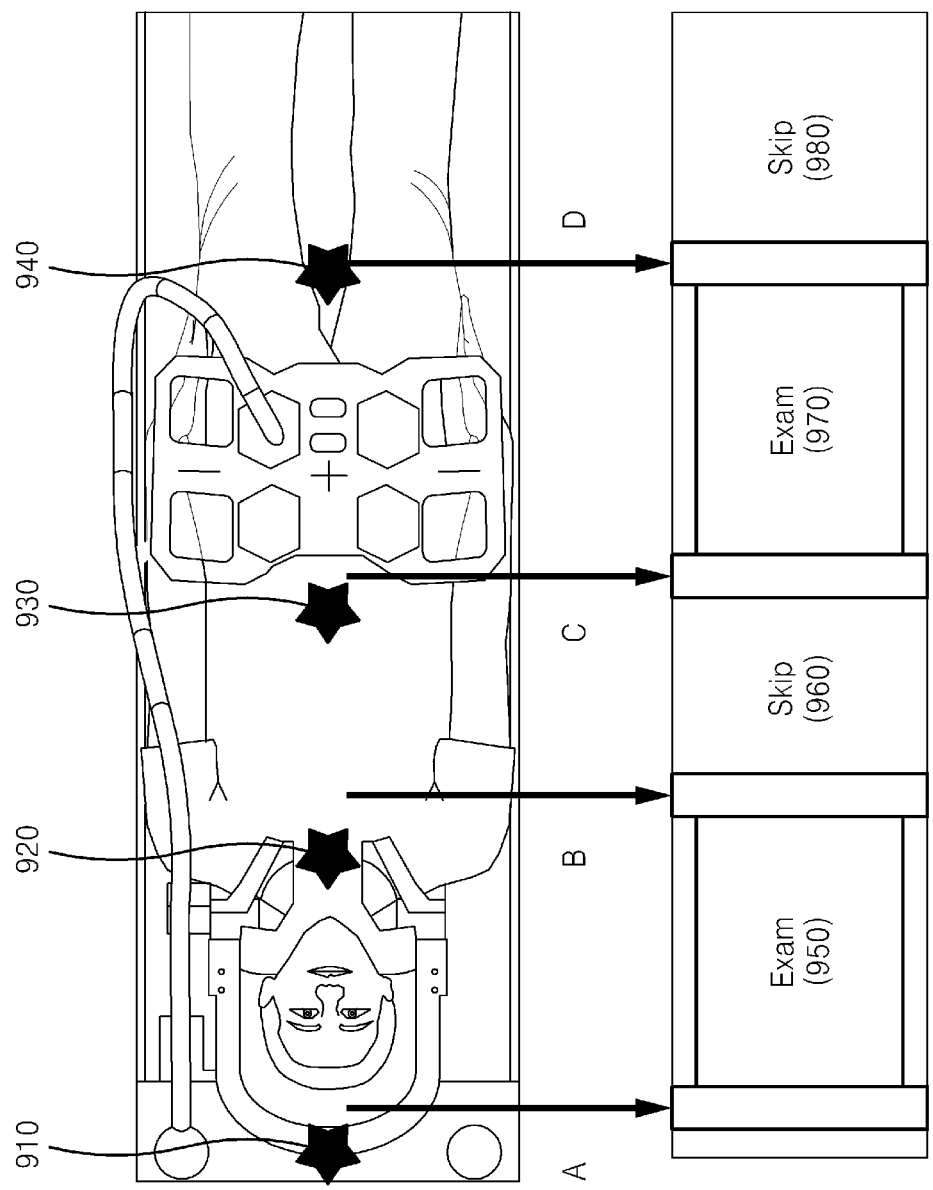
FIG. 9 illustrates setting of image regions on an object according to an exemplary embodiment.

FIG. 9 illustrates setting of a plurality of N image regions in the object 2000 according to an exemplary embodiment.

According to an exemplary embodiment, two image regions, i. e., first and second image regions, are set on the object 2000. As illustrated in FIG. 9, the first image region may be set to extend from the position A of the beginning of the brain region to the position B of the beginning of the breast region. The second image region may be set to extend from the position C of the beginning of the pelvis region to the position D of the end of the thigh region.

For example, reference numerals 910 and 920 may denote start and end positions of the first image region, respectively, and reference numerals 930 and 940 may denote start and end positions of the second image region, respectively. In order to set the plurality of image regions, the positions A, B, C, and D may be entered as positions corresponding to positions 910, 920, 930, and 940, respectively, into the MRI system and stored in a memory.

The first image region extending from the position A to the position B and the second image region extending from the position C to the position D may be set as first and second examination sections 950 and 970, respectively. The regions extending from the position B to the position C and beyond the position D may be set as first and second skip sections 960 and 980, respectively. Imaging conditions may be set for each of the sections 950, 960, 970, and 980.

In a method of setting start and end positions for each image region, the start and end positions may be automatically set without user input by identifying attachments affixed to an object or a table on which the object is located.

For example, since a head coil and a pelvis coil used to image the first and second examination sections 950 and 970, respectively, are connected to identifiable coil connectors on the table, the MRI system may identify the locations of the respective coils and, thus, determine the examination sections. Alternatively, by placing the coils at predetermined positions, the MRI system may be configured to know the positions of the coils.

Such an MRI system configured to identify the positions of coils may automatically identify start and end positions of an image region in an object by associating the coils to the image region.

Thus, a width of the image region may be determined according to a width of the corresponding coil. Furthermore, by making the center of the image region coincide with the center of the coil, the MRI system may automatically identify the center of the coil and set an upper width and a lower width from the center of the coil to correspond to the imaging start point and the imaging end point of the image region.

Alternatively, the start and end positions of the image region may be set by using a signal received through an external input device. More specifically, the table 1200 with the object 2000 or a laser pointer fixed thereto moves to set the start and end positions of the image region. An external input is received when the position A corresponding to the start position of the first image region, the position B corresponding to the end position thereof, the position C corresponding to the start position of the second image region, and the position D corresponding to the end position thereof coincide with the position of the laser pointer used as a reference position. For example, if it is assumed that the table 1200 moves while the laser pointer is fixed, an external input is received when a point indicated by the laser pointer coincides with the position A. When the table 1200 is moved so that a point indicated by the laser pointer coincides with one of the positions B, C, or D, other external inputs may be received.

When a single button is used as the external input device 100 for setting image regions, an image region definer 110 may be configured to set start and end positions of an image region so that they correspond to a point of an odd-numbered input and a point of an even-numbered input, respectively. Alternatively, the start and end positions of the image region may be set so that they correspond to a point of an even-numbered input and a point of an odd-numbered input, respectively. In an exemplary embodiment illustrated in FIG. 9, upon pressing the button when the table 1200 moves so that the position of the laser pointer corresponds to position A and then pressing it again when the position of the laser pointer corresponds to position B, an examination section from position A to position B is set. Thereafter, by pressing the button sequentially when the table 1200 moves so that the position of the laser pointer corresponds to position C and then when the position of the laser pointer corresponds to position D, an examination section from position C to position D is set.

Alternatively, when a single button is used as the external input device, the start and end positions of the image region may be set upon initiating and terminating a signal that is kept in the same state (ON or OFF) for a predetermined time period, respectively. In an exemplary embodiment illustrated in FIG. 9, by pressing and holding the button when the table 1200 moves so that the position of the laser pointer corresponds to position A and then releasing the button when the position of the laser pointer corresponds to position B, a first examination section from position A to position B may be set.

In another exemplary embodiment, two buttons may be used as the external input device, and imaging start and end points may be set so that they correspond to points in time when the respective buttons are pressed. In an exemplary embodiment illustrated in FIG. 9, a start position of an image region may be set by pressing a first button when the table 1200 moves when the position of the laser pointer corresponds to position A. An end position of the image region may be set by pressing a second button when the position of the laser pointer corresponds to position B.

In an exemplary embodiment, the external input device may be incorporated in the table 1200 on which the object 2000 is placed. When the external input device is built in the table 1200, the external input device may be disposed along one side of the table 1200. Thus, start and end positions of an image region may be set without using the laser pointer, i.e., by using the external input device disposed along one side of the table 1200 in accordance with a position where the object 2000 lies. According to this method, image regions may be set by moving the table 1200 without manipulating the operating console 1500, and examination may be performed for the image regions.

Alternatively, the external input device may be incorporated into the operating console 1500. When the external input device is built in the operating console 1500, an input may be performed through an input window (not shown) on the operating console 1500. Information may be provided to a user through a monitor of the operating console 1500. The information may be an image of the table 1200 without the object 2000 or with the object 2000 fixed thereto. The object 2000 may be displayed as a skeleton or anatomy map of the human body. When an image of the table 1200 with the object 2000 placed thereon is used, more detailed start and end positions of an image region may be set. The image of the table 1200 may be obtained by using a general imaging device such as a camera.

Depending on the application, when start and end positions of an image region input through the external input device other than the operating console 1500 are not considered as being accurate, the start and end positions thereof may be verified and reset through a window of the operating console 1500.

The external input device may be at least one of a button, a joystick, a touch panel, a switch, and a sensor, but this is not limiting.

Figure 10:
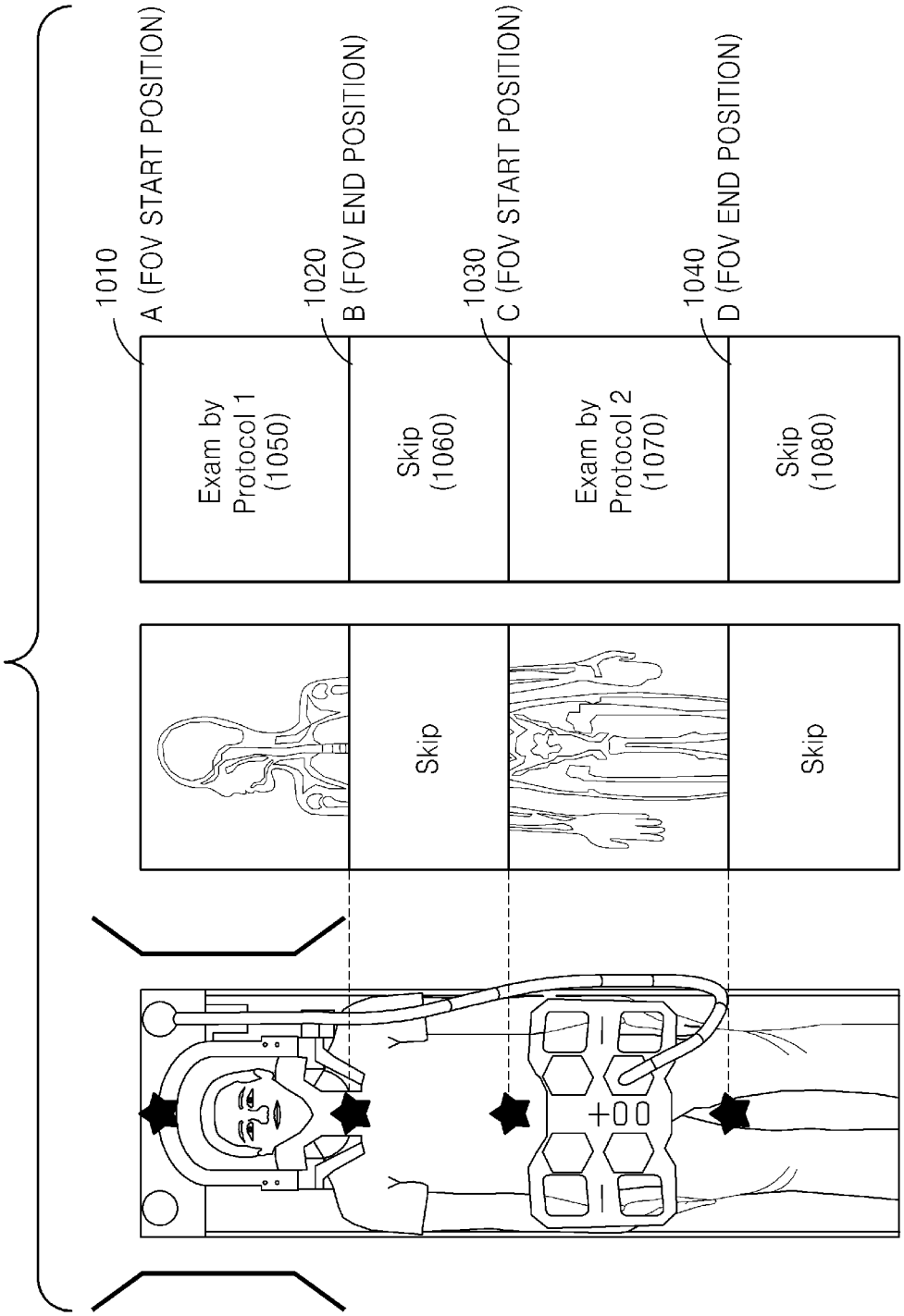
FIG. 10 illustrates setting of imaging conditions for the image regions according to an exemplary embodiment.

FIG. 10 illustrates a process of setting imaging conditions for defined image regions according to an exemplary embodiment.

According to an exemplary embodiment, an imaging condition setter 120 is configured to set the imaging conditions for a plurality of defined image regions includes by displaying information about the plurality of defined image regions on a monitor or a display 130 and setting imaging conditions for the defined image regions based on the displayed information, by using a setting portion 140, such as a display screen.

Through an input operation according to the method illustrated in FIG. 9, a region of the object 2000 from the first start position 1010 (beginning of the brain region A) to the first end position 1020 (beginning of the breast region B) is set as a first image region. A region of the object 2000 from the second start position 1030 (beginning of the abdomen region C) to the second end position 1040 (end of the thigh region D) is set as a second image region. First and second protocols respectively optimized for the first and second image regions are input. After information about the first and second image regions and the first and second protocols are input, an MRI apparatus according to an exemplary embodiment uses the first protocol to image an MR image for a first FOV from the first start position 1010 to the first end position 1020 during a first examination section 1050. The apparatus then skips application of an RF sequence and only moves the table 1200 during a skip section 1060 from the beginning of the breast region B to the beginning of the abdomen region C. The apparatus uses the second protocol to image an MR image for a second FOV from the second start position 1030 (beginning of the abdomen region C) to the second end position 1040 (end of the thigh region D) during a second examination section 1070 and terminates the examination of the object 2000. The section from the first end position 1020 to the second start position 1030 may be defined as a first skip section 1060 during which the RF sequence is not applied, along with a second skip section 1080 from the second end position 1040 to the feet of the object 2000 or to the end of the patient bed. Thus, unnecessary exposure of the object 2000 to a magnetic field may be prevented, thereby reducing adverse effects on the object 2000 due to SAR.

In order to ensure a more precise examination, information about the position of an isocenter may be input together with the positions A through D corresponding to the start and end positions of the first and second image regions. The isocenter may coincide with a center or start position of an image region, but an exemplary embodiment is not limited thereto. For example, the isocenter may be offset from the center or start position of the image region.

When the first and second protocols are different from each other, a movement speed of the table 1200 may vary depending on the protocol used. For example, when a diffusion MRI, perfusion MRI, or functional MRI technique is used to obtain an MRI image of the brain for the first FOV, the movement speed of the table 1200 may be decreased to obtain more accurate data. In another exemplary embodiment, a scanning speed may vary depending on a sequence type. When using a sequence with a fast scanning speed such as a Fast Spin Echo (FSE) sequence or Echo-Planar Imaging (EPI) sequence, the movement speed of the table 1200 may be increased to thereby reduce examination time. The table 1200 may move at higher speed during a skip section in which no examination is performed.

The methods for obtaining an MR image according to one or more exemplary embodiments allow setting of detailed FOVs for a plurality of regions without using a scout image and examination with protocols optimized for the plurality of regions. When the protocol is set for obtaining a scout image, it is possible to obtain a scout image for each of the plurality of regions with one-time setting of the image regions and one-time exam.

The methods for imaging an MR image according to one or more exemplary embodiments enable imaging of a plurality of image regions with one-time setting of the plurality of image regions and imaging conditions and one-time exam.

Additionally, when a scout image of an object cannot be obtained because a wide range of the object needs to be imaged or when MR images have to be taken for different lesions which are located far away from each other although they are in the same local range, the method and apparatus according to an exemplary embodiment define a plurality of image regions on the object and set imaging conditions for each of the plurality of image regions, thereby allowing acquisition of an independent MR image for each of the plurality of regions.

The described-above exemplary embodiments and advantages are merely exemplary and are not to be construed as limiting. The present teaching can be readily applied to other types of apparatuses. The description of exemplary embodiments is intended to be illustrative, and not to limit the scope of the claims, and many alternatives, modifications, and variations will be apparent to those skilled in the art.

What is claimed is:

1. A magnetic resonance imaging (MRI) method comprising:
   defining image regions on an object arranged on a table that is movable, each of the image regions defined to be positioned so that a break is formed between adjacent image regions;
   setting imaging conditions for the defined image regions; and
   acquiring MR images for the defined image regions according to the imaging conditions,
   wherein the setting the imaging conditions comprises displaying information about the defined image regions and setting the imaging conditions for the defined image regions based on the displayed information,
   wherein the acquiring the MR images for the image regions comprises:
      applying a radio frequency (RF) pulse to the defined image regions while controlling the table to move at a pre-defined speed for each of the defined image regions, respectively, and
      controlling the table to move at a higher speed than each pre-defined speed while skipping an application of the RF pulse, for regions including the break.

2. The MRI method of claim 1, wherein the imaging conditions include information about a protocol for each of the image regions, and
   each protocol is set differently for each of the image regions, respectively.

3. The MRI method of claim 2, wherein the imaging conditions are set so that an acquisition of a scout image is omitted.

4. The MRI method of claim 1, wherein the imaging conditions are set so that a scout image is acquired.

5. The MRI method of claim 1, wherein the imaging conditions include pre-defined speed of the table for each of the image regions, respectively, and
   the pre-defined speed of the table is set differently for each of the image regions, respectively.

6. The MRI method of claim 1, wherein the defining the image regions further comprises:
   automatically setting at least one from among an imaging start point and an imaging end point for each of the image regions by using an attachment affixed to the object or to the table.

7. The MRI method of claim 1, wherein the defining the image regions further comprises:
   setting at least one from among an imaging start point and an imaging end point for each of the image regions by an external signal which is input through an external input device.

8. The MRI method of claim 7, further comprising:
   setting, by the external input device, the imaging start point and the imaging end point when initiating and terminating the external signal through the external input device, respectively,
   wherein the external signal is supplied for a time period.

9. The MRI method of claim 7, wherein the external input device is built in the table.

10. The MRI method of claim 7, wherein the external input device is built in an operating console.

11. The MRI method of claim 7, wherein the external input device comprises at least one from among a button, a joystick, a touch panel, a switch, and a sensor.

12. A magnetic resonance imaging (MRI) apparatus comprising:
an image region definer configured to define image regions on an object arranged on a table that is movable, each of the image regions defined to be positioned so that a break is formed between adjacent image regions;
an imaging condition setter configured to set imaging conditions for the defined image regions; and
an image processor configured to acquire MR images for the image regions according to the set imaging conditions,
wherein the imaging condition setter comprises:
a display configured to display information about the defined image regions, and
a setting portion configured to set the imaging conditions for the image regions based on the displayed information,
wherein the image processor is further configured to apply a radio frequency (RF) pulse to the defined image regions while the table is moved at a pre-defined speed for each of the defined image regions, respectively, and skip application of the RF pulse to regions including the break while the table is moved at a higher speed than each pre-defined speed.

13. The MRI apparatus of claim 12, wherein the imaging conditions include information about a protocol for each of the image regions, and
each protocol is set differently for each of the image regions, respectively.

14. The MRI apparatus of claim 13, wherein the imaging conditions for the image regions are set so that an acquisition of a scout image is omitted.

15. The MRI apparatus of claim 12, wherein the imaging conditions for the image regions are set so that a scout image is acquired.

16. The MRI apparatus of claim 12, wherein the imaging conditions include the pre-defined speed of the table for each of the image regions, respectively, and
the pre-defined speed of the table is set differently for each of the image regions, respectively.

17. The MRI apparatus of claim 12, wherein the image region definer automatically sets at least one from among an imaging start point and an imaging end point for each of the image regions by using an attachment affixed to the object or to the table.

18. The MRI apparatus of claim 12, further comprising:
an external input device,
wherein the image region definer is further configured to set at least one from among an imaging start point and an imaging end point for each of the image regions by using an external signal which is input via the external input device.

19. The MRI apparatus of claim 18, wherein the image region definer is further configured to set the imaging start point and the imaging end point when initiating and terminating the external signal through the external input device, respectively, and
the external signal is supplied for a time period.

20. The MRI apparatus of claim 18, wherein the external input device is built in the table.

21. The MRI apparatus of claim 18, wherein the external input device is built in an operating console.

22. The MRI apparatus of claim 18, wherein the external input device comprises at least one from among a button, a joystick, a touch panel, a switch, and a sensor.

23. A non-transitory computer-readable recording medium having recorded thereon a program which, when executed by a computer, causes the computer to execute the MRI method of claim 1.

24. The MRI method of claim 1, wherein the defining the image regions further comprises:
setting a first start position of a first image region, among the image regions;
setting a first end position of the first image region;
setting a second start position of a second image region, among the image regions, the second start position being different from the first end position of the first image region, so that the break between the first image region and the second image region is defined; and
setting a second end position of the second image region.

25. The MRI apparatus of claim 12, wherein the image region definer is further configured to define the image regions by:
setting a first start position of a first image region, among the image regions;
setting a first end position of the first image region;
setting a second start position of a second image region, among the image regions, the second start position being different from the first end position of the first image region, so that the break between the first image region and the second image region is defined; and
setting a second end position of the second image region.

26. The MRI method of claim 1, wherein the table is divided into a plurality of examination sections disposed consecutively one after another, and
the defining the image regions further comprises:
defining each of the image regions of the object to be respectively associated with first examination sections, among the plurality of examination sections, and
defining the break to be associated with a second examination section, among the plurality of examination sections, the second examination section being sandwiched on the table between a pair of the first examination sections.

27. The MRI method of claim 1, wherein each of the image regions of the object is a region of interest (ROI) of the object, and
the acquiring the MR images further comprises generating an image for each ROI from MR signals acquired within the ROI in response to the application of the RF pulse within the ROI.

* * * * *